(12) United States Patent
Moors et al.

(10) Patent No.: US 7,092,072 B2
(45) Date of Patent: Aug. 15, 2006

(54) CALIBRATION APPARATUS AND METHOD OF CALIBRATING A RADIATION SENSOR IN A LITHOGRAPHIC APPARATUS

(75) Inventors: Johannes Hubertus Josephina Moors, Helmond (NL); Uwe Mickan, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 201 days.

(21) Appl. No.: 10/882,684

(22) Filed: Jul. 2, 2004

(65) Prior Publication Data

US 2006/0001856 A1 Jan. 5, 2006

(51) Int. Cl.
*G03B 27/72* (2006.01)
*G03B 27/54* (2006.01)
(52) U.S. Cl. .......................................... 355/69; 355/67
(58) Field of Classification Search ................ 355/69, 355/67, 53; 250/343, 492.1
See application file for complete search history.

(56) References Cited

U.S. PATENT DOCUMENTS 6,969,857 B1 * 11/2005 Owen ........................ 250/343

* cited by examiner

*Primary Examiner*—Peter B. Kim
(74) *Attorney, Agent, or Firm*—Pillsbury Winthrop Shaw Pittman LLP

(57) ABSTRACT

A calibration apparatus is provided for calibrating a radiation sensor in a lithographic apparatus. The calibration apparatus includes a window formed of substantially radiation-transparent material for allowing radiation to pass therethrough to reach the radiation sensor. A first reference sensor is located behind the window, having an active surface abutting the window, for measuring the intensity of radiation which passes through the window. A second reference sensor is located a short distance behind the window, having an active surface facing the window, for measuring the intensity of radiation which passes through the window, a first contamination layer formed on the window, and a second contamination layer formed on the active surface of the second reference sensor. The radiation sensor can be calibrated by combining the measurements from the first and second radiation sensors.

41 Claims, 2 Drawing Sheets

CALIBRATION APPARATUS AND METHOD OF CALIBRATING A RADIATION SENSOR IN A LITHOGRAPHIC APPARATUS

BACKGROUND OF THE INVENTION

1. Field of the Invention

The present invention relates to a calibration apparatus and a method of calibrating a radiation sensor in a lithographic apparatus, and is concerned more particularly, although not exclusively, with calibration of a lithographic apparatus designed to be used with radiation having a wavelength in the Extreme Ultra-Violet (EUV) range and wherein the lithographic apparatus comprises a sensor for measuring the radiation dose falling on a substrate.

2. Description of the Related Art

A lithographic apparatus is a machine that applies a desired pattern onto a target portion of a substrate. Lithographic apparatus can be used, for example, in the manufacture of integrated circuits (ICs). In that circumstance, a lithographic patterning device, which is alternatively referred to as a "mask" or "reticle," may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (i.e., resist).

In general, a single substrate will contain a network of adjacent target portions that are successively exposed. Known lithographic apparatus include so-called steppers, in which each target portion is irradiated by exposing an entire pattern onto the target portion in one go, while in so-called scanners, each target portion is irradiated by scanning the pattern through the projection beam in a given direction (the "scanning"-direction) while synchronously scanning the substrate parallel or anti-parallel to this direction.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit (IC).

The patterning device may be transmissive or reflective. Examples of patterning means include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

As noted above, during the manufacturing process employing a lithographic apparatus, the pattern of the patterning device (e.g. mask or reticle) is imaged or exposed by having radiation impinge onto the patterning device and eventually to the substrate that is at least partially covered by a layer of radiation-sensitive material (e.g. resist). The effect on the resist of radiation falling thereon is highly sensitive to the dose of radiation. It is, therefore, necessary to measure the radiation falling on the substrate target portion. This is achieved by the provision of a sensor (e.g. a photodiode) on the stage onto which the substrate is held.

An important parameter in lithography is the size of features of the pattern applied to the substrate. It is desirable to produce apparatus capable of resolving features as small and close together as possible. A number of parameters affect the available resolution of features, and one of the most important of these is the wavelength of the radiation used to expose the pattern.

It is anticipated that the use of EUV lithography will enable the manufacture of feature sizes below 32 nm using radiation with an EUV (Extreme Ultra Violet) wavelength between 5 and 20 nm, and typically 13.5 nm. Radiation at this wavelength is absorbed in most materials, and the substrate is enclosed within a vacuum chamber to prevent attenuation of the radiation beam. The sensor referred to above is also enclosed within the vacuum chamber.

A serious problem with current EUV lithography systems is contamination inside the vacuum chamber. All surfaces inside the vacuum chamber include molecules which are only weakly bonded, and contaminants are emitted from these surfaces when the chamber is evacuated. In particular, when the layer of resist provided on the substrate is illuminated by radiation, particularly large levels of contaminants are released. This occurs because of the energy of EUV photons, which is higher than chemical bond strengths.

These contaminants typically include hydrocarbons, water and/or sulphur, although it will be appreciated that other materials may also be released. Because the contaminant molecules are released into a vacuum they rapidly disperse throughout the vacuum chamber and build up over time on all surfaces within the vacuum chamber, including the active surface of the radiation sensor. When a surface with contaminant build-up is exposed to EUV radiation (e.g. the active surface of the radiation sensor) the contaminants are "baked on" by the EUV exposure. Further contamination occurs by oxidation of illuminated surfaces within the vacuum chamber.

The contamination of the radiation sensor surface leads to a degradation in the performance of the sensor. The sensitivity of the sensor thus decreases over time, and it becomes unreliable for measuring the absolute radiation dose received at the substrate.

In order to overcome this problem, radiation sensors are normally calibrated at regular time intervals using external reference sensors. However, in the case of EUV systems, these external reference sensors are also subject to contamination. Even if they are contained within a separate vacuum chamber contaminants will be baked on each time the reference sensors are used to measure radiation. Thus over many calibrations the contamination even on the reference sensor will build up. Because the amount of contamination on the reference sensor is then unknown, an absolute calibration of the radiation sensor becomes impossible.

SUMMARY OF THE INVENTION

One way around the above-identified problems is to use the external reference sensor as little as possible to prevent contamination build-up, but this results in infrequent calibration of the radiation sensor and is not a satisfactory solution. Alternatively a sensor "cascade" may be used, in which a number of calibration sensors are provided and used a differing number of times. This is complicated and still subject to inaccuracies. Furthermore, because contaminants can build up on a surface even when it is not exposed to radiation, and one exposure to radiation is sufficient to bake the built-up contaminants onto that surface, even a cascade of sensors may be subject to considerable contamination.

There is therefore a need for a reference sensor which enables an absolute calibration of the radiation sensor.

It will be appreciated that similar considerations apply for lithography using radiation having a wavelength falling outside the EUV band. For example, a projection system for lithography using radiation having a wavelength of 157 nm may also require the substrate to be kept under a vacuum or purge gas.

For at least these reasons, the principles of the present invention, as embodied and broadly described herein, provide a calibration apparatus that calibrates a radiation sensor in a lithographic apparatus having an illumination system. In one embodiment, the apparatus comprises a window formed of substantially radiation-transparent material that allows radiation to pass therethrough to reach the radiation sensor; a first reference sensor located behind the window and having an active surface abutting the window, the first reference sensor configured to measure an intensity of radiation that passes through the window; and a second reference sensor located behind the window and having an active surface facing but not abutting the window, the second reference sensor configured to measure the intensity of radiation that passes through the window, through a first contamination layer formed on the window, and through a second contamination layer formed on the active surface of the second reference sensor.

The first contamination layer which forms on the window will have approximately the same thickness and composition as the second contamination layer which forms on the active surface of the second reference sensor. The first reference sensor measures the intensity of radiation which has passed through only a contamination layer on top of the window. The second reference sensor measures the intensity of radiation which has passed through two identical contamination layers. The intensity of radiation which has passed through the window and the first contamination layer (and which goes on to illuminate the substrate table and radiation sensor) can be calculated by comparing the intensities as measured by the first and second reference sensors. Another requirement is that the contamination layers are uniform with respect to thickness and composition at least in the region of the radiation sensor and first and second reference sensors.

In a preferred embodiment, a layer of substantially radiation-transparent material is formed on the active surface of the second reference sensor. This material is preferably the same material as used in the window, which may be, for example, Zirconium. The contamination rate on the active surface of the second reference sensor and the window should thus be the same, or at least very similar, ensuring that the first and second contamination layers have approximately the same thickness. It is possible to use different materials, as long as the relationship between the contamination rates for the two materials is known so that it can be compensated for in the calculation of the intensity of radiation passing through only the first contamination layer. In an alternative embodiment, the window is formed from the same material as the active surface of the second reference sensor.

Typically the radiation sensor, first and second reference sensors and window are enclosed within a vacuum chamber.

The intensity of the radiation reaching the radiation sensor may be calculated from an average of the intensity measured by the first reference sensor and the intensity measured by the second reference sensor. Alternatively, the intensity of the radiation reaching the radiation sensor may be calculated from the square root of the product of the intensity measured by the first reference sensor and the intensity measured by the second reference sensor. The radiation sensor is preferably calibrated from the calculated intensity of radiation reaching the radiation sensor.

In one embodiment the radiation beam exiting the projection system may be used to calibrate the radiation sensor. In order to reduce the rate of contamination build-up, the window and first and second reference sensors are preferably movable between a first position outside the path of the projection beam and a second position in the path of the projection beam.

In an alternative embodiment another radiation source, for example a Röntgen tube, provides a reference beam of radiation. The advantage of this embodiment is the provision of a substantially parallel beam of radiation. The window and first and second reference sensors may be located in the path of the reference beam. If this arrangement is used the radiation sensor is preferably movable between a first position outside the path of the reference beam and a second position in the path of the reference beam.

The radiation source may be enclosed within a high vacuum chamber, which may include a getter electrode to improve the quality of vacuum still further. The window preferably forms a wall of the high vacuum chamber, thereby substantially preventing contamination of the surface of the window facing the radiation source.

The first reference sensor may be grown directly on the window. Alternatively the first reference sensor may be mounted on the window using a vacuum seal to prevent contaminants from reaching the active surface thereof.

A focusing element, for example a zone plate, may be provided to increase the intensity of radiation passing through the window. This is useful for the situation when the intensity of radiation reaching the substrate table is otherwise very small, for example due to attenuation of the beam by the window. This might be required if calibration of the radiation sensor is to be carried out over the total usable range.

The radiation sensor may be located on or near the substrate table of a lithographic apparatus for measuring the radiation illuminating a substrate. Alternatively the radiation sensor may be located on a support structure for measuring the radiation illuminating a patterning means in a lithographic apparatus.

According to another aspect of the invention there is provided a lithographic apparatus comprising a substrate holder configured to hold a substrate; an illumination system configured to condition a beam of radiation; a support structure configured to support a patterning device that imparts a desired pattern onto the beam of radiation; a projection system that projects the patterned beam onto a target portion of the substrate; a radiation sensor configured to measure an intensity of radiation illuminating the substrate; and a calibration apparatus configured to calibrate the radiation sensor. The calibration apparatus comprises a window formed of substantially radiation-transparent material that allows radiation to pass therethrough to reach the radiation sensor; a first reference sensor located behind the window and having an active surface abutting the window, the first reference sensor configured to measure the intensity of radiation that passes through the window; and a second reference sensor located behind the window and having an active surface facing but not abutting the window, the second reference sensor configured to measure the intensity of radiation that passes through the window, through a first contamination layer formed on the window, and through a second contamination layer formed on the active surface of the second reference sensor.

According to a further aspect of the invention, there is provided a method of calibrating a radiation sensor in a lithographic apparatus, comprising projecting a radiation beam through a window formed of substantially radiation-transparent material to the radiation sensor; measuring an intensity of radiation which passes through the window using a first reference sensor located behind the window and having an active surface abutting the window; employing a second reference sensor, located behind the window and having an active surface facing but not abutting the window; measuring the intensity of radiation which passes through the window, through a contamination layer formed on the window, and through a second contamination layer formed on the active surface of the second reference sensor; calculating the intensity of radiation reaching the radiation sensor from the intensity measured by the first and second sensors; and calibrating the radiation sensor using the calculated intensity.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively.

The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The support structure supports, i.e. bears the weight of, the patterning means. It holds the patterning means in a way depending on the orientation of the patterning means, the design of the lithographic apparatus, and other conditions, such as for example whether or not the patterning means is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning means is at a desired position, for example with respect to the projection system. Any use of the terms "reticle" or "mask" herein may be considered synonymous with the more general term "patterning means".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Lithographic Apparatus

Figure 1:
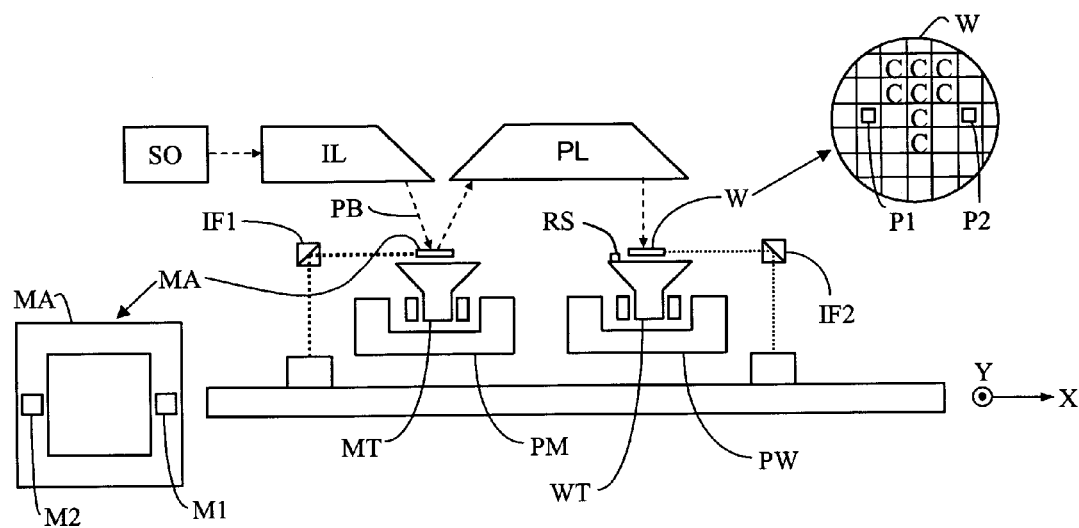
FIG. 1 depicts a lithographic apparatus.

FIG. 1 schematically depicts a lithographic apparatus 1 according to an embodiment of the invention. The apparatus 1 comprises:

an illumination system (illuminator) IL: for providing a projection beam PB of radiation (e.g., UV or EUV radiation).

a first support structure (e.g., a mask table/holder) MT: for supporting patterning device (e.g., a mask) MA and coupled to first positioning mechanism PM for accurately positioning the patterning device with respect to item PL;

a substrate table (e.g., a wafer table/holder) WT: for holding a substrate (e.g., a resist-coated wafer) W and coupled to second positioning mechanism PW for accurately positioning the substrate with respect to item PL; and a projection system (e.g., a reflective projection lens) PL: for imaging a pattern imparted to the projection beam PB by patterning device MA onto a target portion C (e.g., comprising one or more dies) of the substrate W.

As here depicted, the apparatus is of a reflective type (e.g., employing a reflective mask or a programmable mirror array of a type as referred to above). Alternatively, the apparatus may be of a transmissive type (e.g., employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise adjusting mechanism for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning mechanism PW and position sensor IF2 (e.g., an interferometric device), the substrate table WT can be moved accurately, e.g., so as to position different target portions C in the path of the beam PB. Similarly, the first positioning mechanism PM and position sensor IF1 can be used to accurately position the mask MA with respect to the path of the beam PB, e.g., after mechanical retrieval from a mask library, or during a scan. In general, movement of the object tables MT and WT will be realized with the aid of a long-stroke module and a short-stroke module, which form part of the positioning mechanism PM and PW. However, in the case of a stepper (as opposed to a scanner). the mask table MT may be coupled to a short stroke actuator only, or may be fixed. Mask MA and substrate W may be aligned using mask alignment marks M1, M2 and substrate alignment marks P1, P2.

The depicted apparatus can be used in the following preferred modes:
   step mode: the mask table MT and the substrate table WT are kept essentially stationary, while an entire pattern imparted to the projection beam is projected onto a target portion C in one go (i.e., a single static exposure). The substrate table WT is then shifted in the X and/or Y direction so that a different target portion C can be exposed. In step mode, the maximum size of the exposure field limits the size of the target portion C imaged in a single static exposure.
   scan mode: the mask table MT and the substrate table WT are scanned synchronously while a pattern imparted to the projection beam is projected onto a target portion C (i.e., a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
   other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

One or more radiation sensors RS are mounted on the substrate table WT to measure the dose (intensity integrated over time) of radiation received by the wafer W. The substrate is a silicon wafer coated with a radiation-sensitive layer (resist). Current 200 mm and 300 mm wafers are circular with a small notch (not shown) indicating the silicon crystal axis. Current stages are square or rectangular. This gives four areas surrounding a wafer where sensors or marks can be conveniently located, such as fiducial marks used in the alignment process, TIS sensors used for the measurement of wavefront aberrations, or a spot sensor which is typically a radiation sensor with a tiny pin-hole of 120 μm diameter. The radiation sensors RS may be, for example, photodiodes, spot sensors, or CCD sensors.

It will be appreciated that the radiation sensors RS do not measure the illumination received by the wafer W directly. When a target area on the wafer (die) is being illuminated, it is impossible to measure the beam intensity with the radiation sensor located next to the wafer on the wafer stage, because there is only one projection beam which cannot at the same time illuminate the die and the radiation sensor. In practice, about 1% of the projection beam in the illumination system is coupled out to another radiation sensor, known as an energy sensor (not shown). This energy sensor is able to measure the intensity of the projection beam during the exposure of a target area on the wafer. The read-out of the energy sensor, however, is not an absolute measure of the intensity at wafer level, as many optical elements act on the projection beam after measurement by the energy sensor, but before the beam reaches the wafer W. For example, the read-out of the energy sensor depends inter alia on the illumination mode and transmission changes in the lens. This additional energy sensor must therefore be calibrated with the radiation sensor RS (spot sensor) at wafer level at regular intervals.

When high frequency radiation is used, for example Extreme Ultra Violet (EUV) radiation having a wavelength in the range of 5–20 nm, or Deep Ultra Violet (DUV) radiation having a wavelength less than 300 nm and typically 157 nm, the wafer W is kept under vacuum during irradiation. A major problem for such lithographic systems is contamination, i.e. the build up of carbon on, or the oxidation of, any surface inside the vacuum that is illuminated by radiation. The wafer W and other surfaces within the vacuum chamber release into the vacuum contaminating gases such as $H_2O$ and $C_xH_y$, and these build up on surfaces within the vacuum, and are baked on when these surfaces are illuminated.

This leads to a build up over time of contamination on the surface of the radiation sensors RS, resulting in a corresponding decrease in sensitivity. It is therefore necessary to calibrate the radiation sensors RS to ensure that the dose received by the wafer W can be accurately measured.

Figure 2:
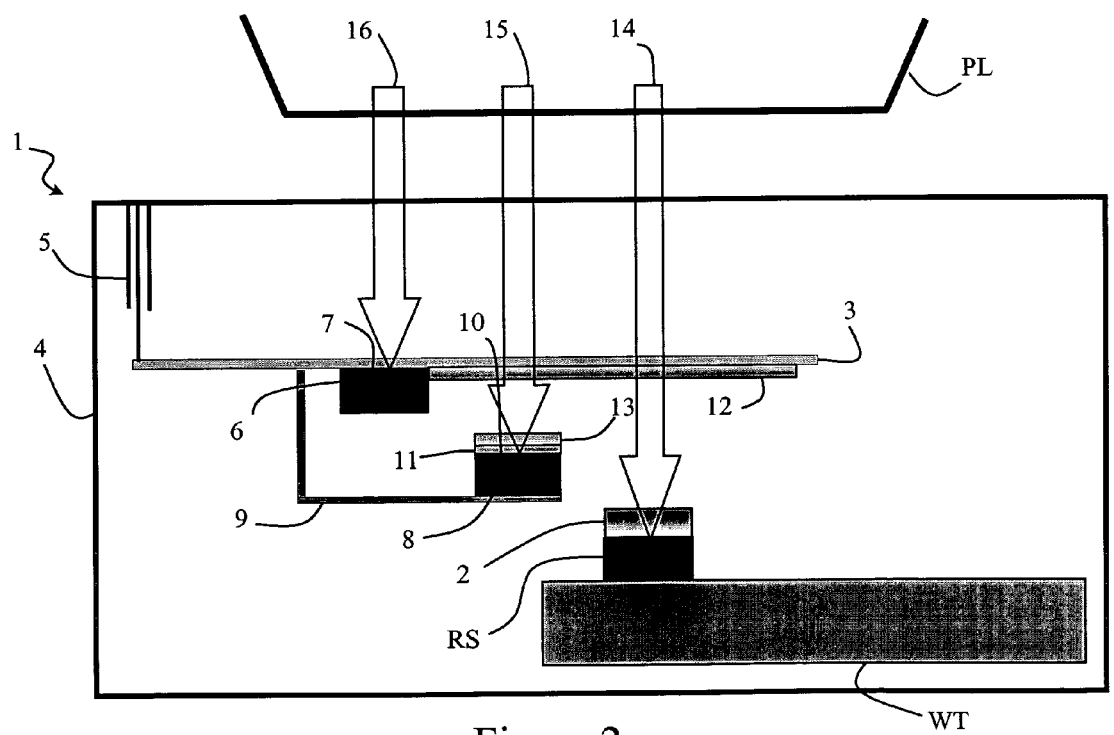
FIG. 2 depicts one embodiment of a calibration apparatus in accordance with the invention.

FIG. 2 schematically depicts one embodiment of a calibration apparatus 1 in accordance with the present invention for calibrating a radiation sensor RS whose performance has been degraded by accretion of a contamination layer 2. The calibration apparatus 1 includes a window 3 formed of a material relatively transparent to EUV radiation. A suitable material is Zirconium: a Zr window of thickness 100 nm has a transmission of approximately 71% for radiation in the EUV range. It should be appreciated that the radiation-transparent material can be other appropriate materials and can have a transmission of less than 71%. The window 3 is enclosed in a vacuum chamber 4 with the substrate table WT and radiation sensor RS, beneath the projection system PL. The window 3 is mounted, via a rotational coupling 5, to the housing of the vacuum chamber 4, enabling it to be moved from a first location (not shown) in which radiation from the projection system PL does not pass through the window 3, to a second location (shown in FIG. 2) in which radiation from the projection system PL will pass through the window 3.

Attached to the side of the window facing away from the projection system (the underside as shown in FIG. 2) is a first reference sensor 6 having an active surface 7 for measuring radiation intensity. The first reference sensor 6 may be a photodiode, or any photodetector suitable for measuring the intensity of EUV radiation. The active surface 7 is in contact with the window 3, or otherwise sealed, so that no contamination from within the vacuum chamber 4 can reach the active surface 7. In one embodiment, the first reference sensor 6 is a diode grown on the window 3. Alternatively, the first reference sensor may be mounted with a vacuum seal (not shown) around the interface between the active surface 7 and the window 3.

A second reference sensor 8 is mounted behind the window 3 via a bracket 9, with an active surface 10 facing the window. A thin layer 11 of the same EUV radiation transparent material (e.g. Zr) as the window 3 is deposited on the active surface 10 of the second reference sensor 8. This layer 11 is several nanometres thick; the constraints governing the thickness will be described below.

During normal operation of the lithographic apparatus, the window 3 and associated reference sensors 6, 8 are in the first location outside the path of the projection beam. The radiation sensor RS is used to calibrate an energy sensor that indirectly measures the dose received by a wafer (not shown) on the substrate table WT. During this process, contamination 2 builds up on the radiation sensor RS as it is illuminated by EUV radiation.

When it becomes necessary to calibrate the radiation sensor RS, the window 3 and reference sensors are rotated into the position shown in FIG. 2. Now, as light passes through the window, a contamination layer 12 will form on the back of the window, and another contamination layer 13 will form on the front of the radiation transparent layer 11 deposited on the active surface 10 of the second radiation sensor 8. Since the radiation transparent layer 11 and the window 3 are formed from the same material, the rate of contamination on the two surfaces will be the same, or at least very similar. However, no contamination is formed on the active surface 7 of the first reference sensor 6 because it is sealed against the window 3.

The method of calibration can be understood with reference to three paths of radiation 14, 15, 16 in the projection beam, shown schematically in FIG. 2. The three paths are shown schematically as parallel "sub-beams" and this is a preferable arrangement, but it will be appreciated that they need not be parallel. Radiation in a first path 14 passes through the window 3 and the contamination layer 12 formed on the back surface thereof, and goes on to illuminate the substrate table WT and radiation sensor RS (through the contamination layer 2 formed on its front surface). If the intensity of this radiation 14 is known, then any given radiation intensity 14 at the substrate table can be correlated with the output of the radiation sensor RS behind its layer of contamination 2, enabling calibration of the radiation sensor RS. However, the intensity of radiation in the first path 14 cannot be measured directly.

Radiation in a second path 15 passes through the window 3, and the contamination layer 12 formed on the back surface of the window, and the contamination layer 13 formed on the front surface of the second reference sensor 8. It also passes through the radiation transparent layer 11 deposited on the second reference sensor, but this is thin enough to have a negligible effect on its intensity. Even if this layer would absorb a significant amount of radiation, this can easily be corrected for. Alternatively, the portion of window 3 in front of the second reference sensor 8 could be made thinner by the same amount as the thickness of the radiation transparent layer 11 to compensate for the presence of this layer. The level measured by the second reference sensor 8 thus corresponds to the intensity of radiation which has passed through the window 3 and two contamination layers 12, 13 of the same thickness.

Radiation in a third path 16 passes through the window 3 and is detected by the first reference sensor 6 without passing through any contamination. Thus the level measured by the first reference sensor corresponds to the intensity of radiation passing through the window 3 only.

The intensity of radiation in the first path 14 (which passes through the window 3 and one contamination layer 12), can be calculated from a comparison of the intensities of radiation in the second path 15 (passing through the window 3 and two contamination layers 12, 13) and the third path 16 (passing through the window 3 only).

Absorption is generally an exponential process. Suppose the intensity of radiation in the third path 16 passing through the window 3 and reaching the active surface of the first sensor is $I_3$, and the thickness of the contamination layers 12 and 13 is t. The required intensity $I_1$ of radiation in the first path 14 reaching the contamination layer 2 on the radiation sensor RS, which passes through one contamination layer 12 of thickness t, is given by Lambert-Beer's law: $I_1=I_3e^{-t/l}$ where l is the attenuation length of the contamination material. The intensity $I_2$ of radiation reaching the active surface 10 of the second reference sensor 8, which passes through both contamination layers 12, 13 and thus a total contamination thickness of 2t, is $I_2=I_3e^{-2t/l}$. It can be seen from this that $I_2I_3=I_3e^{-2t/l} \cdot I_3=I_1^2$, so $I_1=\sqrt{I_2I_3}$ and the intensity in the first path 14 is the square root of the product of the intensities in the second 15 and third 16 paths. In other words, the intensity of radiation 14 illuminating the substrate table WT is the square root of the products of the intensities measured by the first and second reference sensors 6, 8.

In practice, the attenuation in the two contamination layers 12, 13 is small enough that a first order approximation may be appropriate, in which case the intensity of radiation 14 illuminating the substrate table WT can be calculated as the mean of the intensities measured by the first and second reference sensors 6, 8.

The thickness of the radiation transparent layer 11 on the active surface 10 of the second reference sensor 8 is chosen to be sufficiently thick that the contamination rate is approximately the same as that of the window 3. However, it needs to be as thin as possible so that the transmission of this layer 11 is as high as possible. As mentioned above, a thickness of a few nanometres provides a suitable balance between the two considerations. As mentioned above, 100 nm of Zr exhibits 29% absorption, so a few nm gives about 1% absorption. Even this small absorption needs to be considered when calculating the relative intensities measure by the first and second reference sensors.

Figure 3:
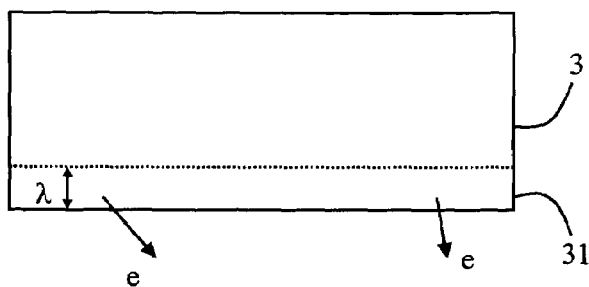
FIG. 3 illustrates the contamination rate on two surfaces.

FIG. 3 illustrates why the contamination rates on the radiation transparent layer 11 on the surface of the second reference sensor 8 and the window 3 are substantially the same when they are formed of the same material (e.g. Zr). The figure shows schematically the edge of the window 3 and the radiation transparent layer 11, having surface layers 31, 32 of width $\lambda$ corresponding to the mean free path of an electron.

The parameters which govern the contamination rate on the layer 11 and the window 3 are the same. Both are exposed to the same vacuum environment, and the same partial pressures of the contaminating gases $H_2O$ and $C_xH_y$. The surface occupation of contaminants is therefore the same on the layer 11 as on the window 3.

A second parameter that might affect the issue is the number of incident photons and the secondary electrons that are created in the surface layers 31, 32. The number of photons is almost the same for both the layer 11 and the window 3, but not entirely. It will be appreciated that the number of photons in the surface layer deviates only due to absorption in this surface layer, not over the complete window 3 or layer 11. The quantum efficiency of the layer 11 and window 3 are the same because of the choice of the same material. The number of secondary electrons is therefore again almost the same for both.

The mean free path $\lambda$ of an electron in a material such as zirconium is typically 0.5 nm. This applies to electrons in an energy range of 1–500 eV for any material, as explained in "Soft X-rays and Extreme Ultraviolet Radiation" by David Attwood (Cambridge University Press, 1999). Electrons generated by EUV photons have energy less than 92 eV (corresponding to a wavelength of 13.5 nm) and the lower limit for contamination is typically several eV, the energy of a chemical bond.

The number of electrons generated depends on the number of absorbed photons. Since the materials are the same, the quantum efficiencies are the same, and only the number of photons determines the number of electrons. The attenuation length ($\alpha$) of EUV in solids is typically 10–500 nm. For example zirconium has an attenuation length $\alpha=290$ nm. The transmission over twice the mean free path is:

$$I_{rel} = e^{-\frac{2\lambda}{\alpha}} = 99.7\% \text{ (where } \lambda = 0.5 \text{ nm}, \alpha = 290 \text{ nm)}.$$

This means that the maximum difference in intensity is only 0.3%. Depending on the illumination source and cleanliness of the environment, the contamination rate depends linearly on the intensity or does not depend on intensity at all. This is due to what the rate limiting factor is: the number of molecules on the surface or the number of electrons generated that activate these molecules.

In other words, the difference in relative contamination rate between the two surfaces is between 0 and 0.3%, and the accuracy of the absolute dose calibration will thus be limited by this difference.

Furthermore the rate difference can be predicted (from chosen materials) or measured separately and then be corrected for. Alternatively or additionally, the rate difference can be measured (beforehand or during operation) by insertion of a third sensor.

It will be appreciated that it is not necessary for the radiation transparent layer 11 formed on the second reference sensor to be formed of the same material as the window 3. As long as the relationship between the contamination rates for the two materials is known, then the calculation of the desired intensity 14 can be weighted to take this into account.

Figure 4:
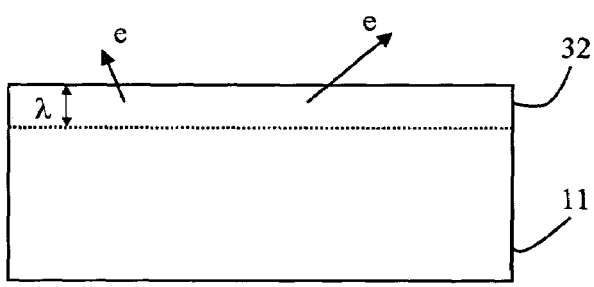
FIG. 4 depicts an alternative embodiment of calibration apparatus in accordance with the invention.
Figure 4:
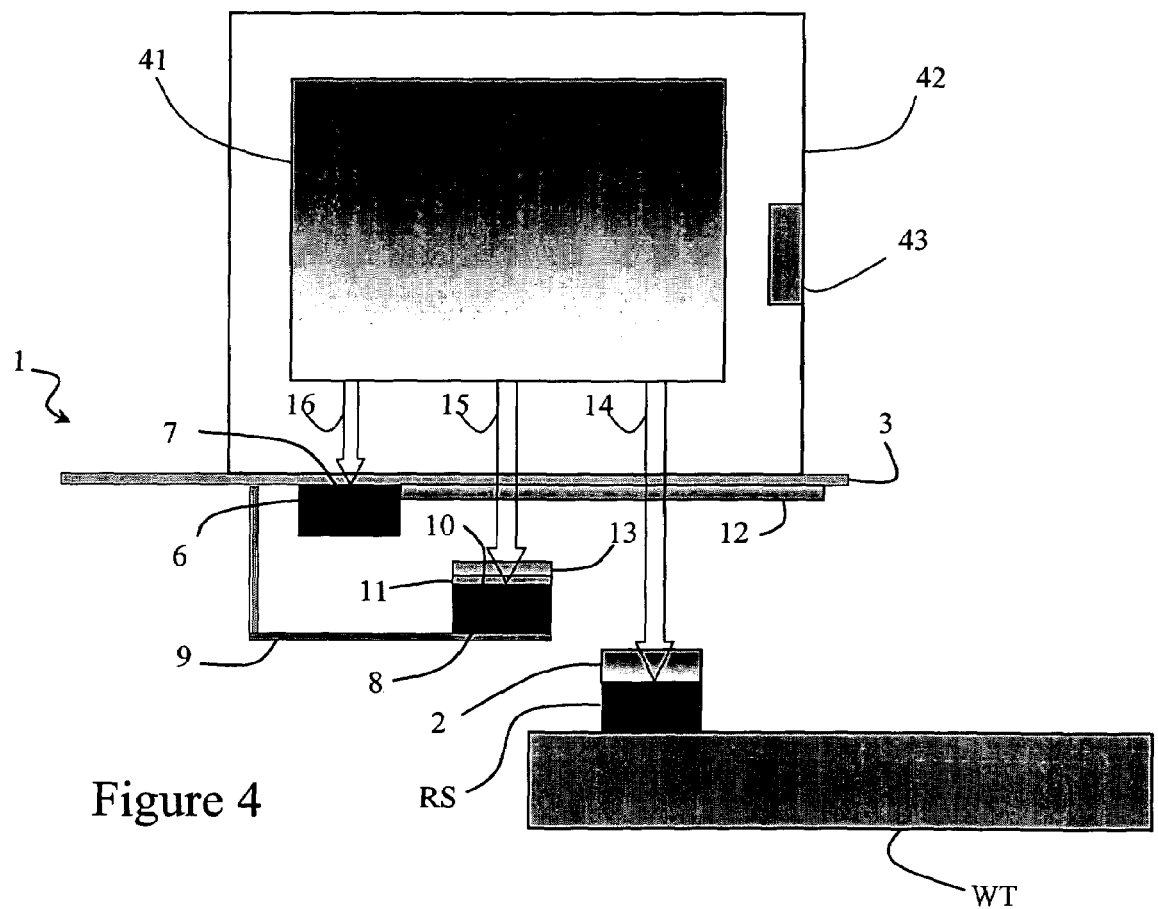

An alternative embodiment of a calibration apparatus in accordance with the invention is depicted schematically in FIG. 4. The apparatus of FIG. 4 is similar to that of FIG. 2, and similar components are indicated using the same reference numerals. The calibration apparatus works in a similar manner, except that the window 3 and reference sensors 6, 8 are not movable in and out of the projection beam. Instead, the calibration apparatus includes a separate radiation source 41, distinct from the projection system PL, for providing EUV radiation. In the embodiment shown this source 41 is a Röntgen tube.

The Röntgen tube 41 is mounted in a vacuum chamber 42 which abuts the window 3 (so that the window 3 forms one wall of the vacuum chamber). The vacuum within this chamber is particularly high, and this may be improved still further by the provision of a getter electrode 43 within the chamber 42. This high vacuum reduces the chances of any contamination forming on the upper surface of the window 3.

The window 3 and reference sensors 6, 8 are fixed relative to the Röntgen tube 41. When calibration of the radiation sensor RS is required, the substrate table WT is moved so that it is in the path of radiation emitted by the Röntgen tube 41. Alternatively, the calibration apparatus 1 is moved to the substrate table WT so that the Röntgen tube illuminates the radiation sensor RS as well as the reference sensors 6, 8. The radiation sensor is then calibrated in a similar manner to that used in the embodiment of FIG. 2.

Since the intensity of radiation in the first path 14 is calculated from two directly measured intensities, the stability of the radiation source 41 is not important. Any fluctuations in intensity output will be detected and will not affect the calibration of the radiation sensor RS. Furthermore, the intensity of radiation provided by the Röntgen tube 41 need not be high: if low intensity radiation is used, this will prolong the life of the reference sensors 6, 8 and reduce the rate of build-up of the contamination layers 12, 13. Preferably, the intensity of the reference beam equals the intensity of the exposure beam, so that the radiation sensor is calibrated in the intensity range that is used and a possible non-linear behaviour of the radiation sensor is avoided.

When the intensity is very small (for example due to attenuation in the window 3), then a zone plate or other focussing method (not shown) may be used to increase local intensity. This improves the signal-to-noise ratio in the calibration.

While specific embodiments of the invention have been described above, it will be appreciated that the invention may be practiced otherwise than as described. The description is not intended to limit the invention. For example, the embodiments described above have been described with reference to the calibration of a radiation sensor located at the substrate table and illuminated by the projection beam issuing from the projection system. It will be appreciated that the principles described may be used to calibrate a radiation sensor anywhere, within a lithographic apparatus, where sensors are subject to contamination. Similar sensors may be present, for example, on the mask table MT or at other locations within the illumination system IL and projection system PL. Furthermore, although the sensors described are photodiodes, any suitable sensors such as CCDs may be used.

In addition, the calibration method and apparatus have been described for use with EUV radiation. It will be appreciated that such methods will apply to any sensor system subject to contamination, and this occurs with radiation at other wavelengths, such as for example DUV radiation having a wavelength of 157 nm.

In a further embodiment, the window 3 is formed from the same material as the active surface 10 of the second reference sensor 8. This means that the need for the radiation transparent layer 11 formed on the active surface 10 is removed, since contamination will form at the same rate on the active surface 10 as on the window 3.

What is claimed is:

1. A calibration apparatus that calibrates a radiation sensor in a lithographic apparatus having an illumination system that provides a beam of radiation, said calibration apparatus comprising:
    a window formed of substantially radiation-transparent material that allows radiation to pass therethrough to reach the radiation sensor;
    a first reference sensor located behind the window and having an active surface abutting the window, the first reference sensor configured to measure an intensity of radiation that passes through the window; and
    a second reference sensor located behind the window and having an active surface facing but not abutting the window, the second reference sensor configured to measure the intensity of radiation that passes through the window, through a first contamination layer formed on the window, and through a second contamination layer formed on the active surface of the second reference sensor.

2. The apparatus of claim 1, further comprising a layer of substantially radiation-transparent material formed on the active surface of the second reference sensor.

3. The apparatus of claim 2, wherein the layer of substantially radiation-transparent material on the second reference sensor is formed of the same material as the window.

4. The apparatus of claim 1, wherein the substantially radiation-transparent material comprises zirconium.

5. The apparatus of claim 1, wherein the window is formed from the same material as the active surface of the second reference sensor.

6. The apparatus of claim 1, wherein the radiation sensor, the first and second reference sensors, and the window are enclosed within a vacuum chamber.

7. The apparatus of claim 1, wherein the intensity of the radiation reaching the radiation sensor is calculated from a combination of the intensity measured by the first reference sensor and the intensity measured by the second reference sensor.

8. The apparatus of claim 7, wherein the intensity of the radiation reaching the radiation sensor is calculated based on an average of the intensity measured by the first reference sensor and the intensity measured by the second reference sensor.

9. The apparatus of claim 7, wherein the intensity of the radiation reaching the radiation sensor is calculated based on a product of the intensity measured by the first reference sensor and the intensity measured by the second reference sensor.

10. The apparatus of claim 7, wherein the radiation sensor is calibrated from the calculated intensity of radiation reaching the radiation sensor.

11. The apparatus of claim 1, wherein the window and the first and second reference sensors are movable between a first position, in which they are located outside the path of the projection beam, and a second position, in which they are located in the path of the projection beam.

12. The apparatus of claim 1, further comprising a radiation source, different from the illumination system, configured to provide a reference beam of radiation.

13. The apparatus of claim 12, wherein the window and the first and second reference sensors are located in the path of the reference beam.

14. The apparatus of claim 12, wherein the radiation sensor is movable between a first position outside the path of the reference beam and a second position in the path of the reference beam.

15. The apparatus of claim 12, wherein the radiation source is enclosed within a high vacuum chamber.

16. The apparatus of claim 15, wherein the window forms a wall of the high vacuum chamber to substantially prevent contamination of the surface of the window facing the radiation source.

17. The apparatus of claim 12, wherein the radiation source comprises a Röntgen tube.

18. The apparatus of claim 1, wherein the first reference sensor is grown directly on the window.

19. The apparatus of claim 1, wherein the first reference sensor is mounted on the window using a vacuum seal to prevent contaminants from reaching the active surface thereof.

20. The apparatus of claim 1, further comprising a focusing element to increase the intensity of radiation passing through the window.

21. A lithographic apparatus, comprising:
    a substrate holder configured to hold a substrate;
    an illumination system configured to condition a beam of radiation;
    a support structure configured to support a patterning device that imparts a desired pattern onto the beam of radiation;
    a projection system that projects the patterned beam onto a target portion of the substrate;
    a radiation sensor configured to measure an intensity of radiation illuminating the substrate; and
    a radiation sensor calibrator configured to calibrate the radiation sensor, the calibrator comprising:
        a window formed of a material that allows radiation to pass therethrough to reach the radiation sensor;
        a first reference sensor located behind the window and having an active surface abutting the window, the first reference sensor configured to measure the intensity of radiation that passes through the window; and
        a second reference sensor located behind the window and having an active surface facing but not abutting the window, the second reference sensor configured to measure the intensity of radiation that passes through the window, through a first contamination layer formed on the window, and through a second contamination layer formed on the active surface of the second reference sensor.

22. A method of calibrating a radiation sensor in a lithographic apparatus, comprising:
   projecting a radiation beam through a window to the radiation sensor;
   measuring an intensity of radiation which passes through the window using a first reference sensor located behind the window and having an active surface abutting the window;
   employing a second reference sensor, located behind the window and having an active surface facing but not abutting the window;
   measuring the intensity of radiation which passes through the window, through a contamination layer formed on the window, and through a second contamination layer formed on the active surface of the second reference sensor;
   calculating the intensity of radiation reaching the radiation sensor from the intensity measured by the first and second sensors; and
   calibrating the radiation sensor using the calculated intensity.

23. The method of claim 22, wherein a layer of substantially radiation-transparent material is formed on the active surface of the second reference sensor.

24. The method of claim 23, wherein the layer of substantially radiation-transparent material on the second reference sensor is formed of the same material as the window.

25. The method of claim 22, wherein the window comprises zirconium.

26. The method of claim 22, wherein the window is formed from the same material as the active surface of the second reference sensor.

27. The method of claim 22, wherein the substrate table, the radiation sensor, the first and second reference sensors, and the window are enclosed within a vacuum chamber.

28. The method of claim 22, wherein the intensity of the radiation reaching the radiation sensor is calculated based on an average of the intensity measured by the first reference sensor and the intensity measured by the second reference sensor.

29. The method of claim 22, wherein the intensity of the radiation reaching the radiation sensor is calculated based on a product of the intensity measured by the first reference sensor and the intensity measured by the second reference sensor.

30. The method of claim 22, further comprising moving the window and the first and second reference sensors from a first position outside the path of the patterned beam to a second position in the path of the patterned beam, so that the radiation beam passing through the window is the projection beam.

31. The method of claim 22, wherein the radiation beam passing through the window is a reference beam supplied by a radiation source distinct from the illumination system.

32. The method of claim 31, wherein the first and second reference sensors are located in the path of the reference beam.

33. The method of claim 31, further comprising moving the radiation sensor from a first position outside the path of the reference beam to a second position in the path of the reference beam.

34. The method of claim 31, wherein the radiation source is enclosed within a high vacuum chamber.

35. The method of claim 34, wherein the window forms a wall of the high vacuum chamber to substantially preventing contamination of the surface of the window facing the radiation source.

36. The method of claim 31, wherein the radiation source comprises a Röntgen tube.

37. The method of claim 31, further comprising passing the reference beam though a focussing element to increase the intensity of radiation passing through the window.

38. The method of claim 22, wherein the first reference sensor is grown directly on the window.

39. The method of claim 22, wherein the first reference sensor is mounted on the window using a vacuum seal to prevent contaminants from reaching the active surface thereof.

40. A lithographic apparatus, comprising:
   an illumination system for conditioning a beam of radiation;
   a support structure for supporting a patterning device, the patterning device serving to impart the projection beam with a pattern in its cross-section;
   a projection system for projecting the patterned beam onto a target portion of a substrate;
   a substrate table for holding the substrate;
   a radiation sensor for measuring the radiation dose received by the patterning device;
   a window formed of substantially radiation-transparent material for allowing radiation to pass therethrough to reach the radiation sensor;
   a first reference sensor, located behind the window and having an active surface abutting the window, for measuring the intensity of radiation which passes through the window; and
   a second reference sensor, located behind the window and having an active surface facing but not abutting the window, for measuring the intensity of radiation which passes through the window, a first contamination layer formed on the window, and a second contamination layer formed on the active surface of the second reference sensor.

41. A lithographic apparatus comprising:
   an illumination system for conditioning a beam of radiation;
   a support structure for supporting a patterning device, the patterning device serving to impart the projection beam with a pattern in its cross-section;
   a projection system for projecting the patterned beam onto a target portion of a substrate;
   a substrate table for holding the substrate;
   a radiation sensor for measuring the radiation dose received by the substrate;
   a window formed of substantially radiation-transparent material located in front of the radiation sensor for allowing radiation to pass therethrough to reach the radiation sensor;
   a first reference sensor, located behind the window and having an active surface abutting the window, for measuring the intensity of radiation which passes through the window; and
   a second reference sensor, located behind the window and having an active surface facing but not abutting the window, for measuring the intensity of radiation which passes through the window, a first contamination layer formed on the window, and a second contamination layer formed on the active surface of the second reference sensor.

* * * * *